United States Patent
Yang et al.

(10) Patent No.: US 7,663,904 B2
(45) Date of Patent: Feb. 16, 2010

(54) OPERATING METHOD OF ONE-TIME PROGRAMMABLE READ ONLY MEMORY

(75) Inventors: Ching-Sung Yang, Hsinchu (TW); Wei-Zhe Wong, Tainan (TW); Chih-Chen Cho, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 62 days.

(21) Appl. No.: 12/191,844

(22) Filed: Aug. 14, 2008

(65) Prior Publication Data

US 2008/0316791 A1    Dec. 25, 2008

Related U.S. Application Data

(62) Division of application No. 11/144,471, filed on Jun. 2, 2005, now Pat. No. 7,436,028.

(30) Foreign Application Priority Data

Nov. 9, 2004    (TW) .............................. 93134064 A (51) Int. Cl.
*G11C 7/00*    (2006.01)

(52) U.S. Cl. .................................. 365/104; 365/185.24
(58) Field of Classification Search ................. 365/104, 365/185.24
See application file for complete search history.

(56) References Cited

U.S. PATENT DOCUMENTS

| 6,404,006 B2 * | 6/2002 | Li et al. ....................... 257/321 |
| 6,985,387 B2 * | 1/2006 | Chen et al. ............. 365/189.15 |
| 7,436,028 B2 * | 10/2008 | Yang et al. ................... 257/368 |

* cited by examiner

*Primary Examiner*—Michael T Tran
(74) *Attorney, Agent, or Firm*—J.C. Patents (57) ABSTRACT

The present invention provides a method of operating a one-time programmable read only memory (OTPROM). The OTPROM includes at least a select transistor, an electrode and a dielectric layer disposed on a substrate, wherein the electrode is set up on the source region of the select transistor and the dielectric layer is set up between the electrode and the source region. The method of operating the one-time programmable read only memory includes performing a programming operation to write a digital data value of '1' into the memory and performing a programming operation to write a digital data value of '0' into the memory.

7 Claims, 11 Drawing Sheets

OPERATING METHOD OF ONE-TIME PROGRAMMABLE READ ONLY MEMORY

CROSS-REFERENCE TO RELATED APPLICATION

This application is a divisional of an application Ser. No. 11/144,471, filed on Jun. 2, 2005, now allowed, which claims the priority benefit of Taiwan application serial no. 93134064, filed on Nov. 9, 2004. The entirety of each of the above-mentioned patent applications is hereby incorporated by reference herein and made a part of this specification.

BACKGROUND OF THE INVENTION

1. Field of the Invention

The present invention relates to a semiconductor memory device and operating method thereof. More particularly, the present invention relates to a one-time programmable read only memory and operating method thereof.

2. Description of the Related Art

As the feature size of the semiconductor devices reaches the deep sub-micron range, the dimension of each device is correspondingly reduced. For a memory device, the reduction in dimension implies the area for accommodating of each memory cell is decreased. However, as the quantity of data that needs to be processed and stored inside an electronic communication product (for example, a computer, a mobile phone, a digital camera or a personal digital assistant) continues to increase, the memory inside the electronic product must store an ever-increasing quantity of data. Hence, there is a demand for methods capable of fabricating smaller memory with a larger memory storage capacity. Currently, one major goal of the electronic industry is to fabricate semiconductor devices having a smaller size, a higher level of integration and an improved quality.

According to the difference in reading/writing function, memory can be categorized into two major types: read only memory (ROM) and random access memory (RAM).

The read only memory (ROM) can be further categorized into erasable programmable read only memory (EPROM), electrically erasable programmable read only memory (EE-PROM), mask read only memory (mask ROM) and one-time programmable read only memory (OTPROM).

Although EPROM and EEPROM has both a write-in and an erase function and hence has a wider range of actual applications, these memories also have a more complicated fabrication process and a higher cost of production.

On the other hand, although a mask ROM is simple and inexpensive to fabricate, a photomask is required to define the write-in data. Hence, the mask ROM has some limitations in real applications.

For a one-time programmable read only memory (OTPROM), data can be written into the memory after leaving the factory. In other words, the operating environment of the memory can be programmed through a write-in operation carried out by the users in their premises. Thus, the OTPROM is more convenient to use compared with the mask ROM.

The random access memory (RAM) can be categorized into static random access memory (SRAM) and dynamic random access memory (DRAM).

According to the design method, a DRAM cell generally includes a transistor and a capacitor. A bit of digital data is stored inside each DRAM cell according to the charging state of the capacitor. In other words, the presence or absence of electric charges inside the capacitor on the substrate is used to represent a '0' or a '1' logic state in a binary storage format. However, due to the leakage current in the device, the data stored inside the DRAM cells need to be constantly refreshed leading to power wastage. Moreover, the stored data is lost forever once the power supplying the DRAM is removed.

SUMMARY OF THE INVENTION

Accordingly, at least one objective of the present invention is to provide a one-time programmable read only memory (OTPROM) and operating method thereof. By disposing a dielectric layer that can be set to a breakdown state inside a dynamic random access memory (DRAM) cell, the setting of the breakdown or not of the dielectric layer can be utilized to provide the memory cell with a one-time programming characteristic. Moreover, the programmed data is non-volatile.

At least a second objective of the present invention is to provide a one-time programmable read only memory (OTPROM) and operating method thereof. The breakdown or not of a dielectric layer is utilized to provide a difference in the bit line voltage in a reading operation and hence serve as a base for determining the correct data bit. Furthermore, the DRAM-based design provides the memory with a fast accessing capability.

To achieve these and other advantages and in accordance with the purpose of the invention, as embodied and broadly described herein, the invention provides a one-time programmable read only memory (OTPROM) having a first memory cell. The first memory cell includes a substrate, a select transistor, an electrode and a dielectric layer. The select transistor is disposed on the substrate. The select transistor further includes a first source/drain region and a second source/drain region. The electrode is set up on the first source/drain region. The dielectric layer is set between the electrode and the first source/drain region. The first memory cell stores a digital data through the breakdown or not of the dielectric layer.

The present invention also provides another one-time programmable read only memory (OTPROM) comprising a plurality of memory cells, a plurality of word lines, a plurality of programming lines and a plurality of bit lines. The memory cells are laid down to form a row/column array. Each memory cell includes a substrate, a select transistor, an electrode and a dielectric layer. The select transistor is set up on the substrate. The select transistor includes a first source/drain region and a second source/drain region. The electrode is set up on the first source/drain region of the select transistor. The dielectric layer is set up between the electrode and the first source/drain region. Each memory cell stores a digital data through the breakdown or not of the dielectric layer. Every pair of memory cells in the row direction forms a memory cell group. The select transistor of the memory cells within the same memory cell group use the same drain region. The word lines are connected to the gate of the select transistor of the memory cells in the same row. The programming lines are connected to the electrode of the memory cells in the same column. The bit lines are connected to the second source/drain region of the select transistor of the memory cells in the same row.

In the aforementioned one-time programmable read only memory, a conductive plug is also set up between the dielectric layer and the source region. The conductive plug connects the electrode and the dielectric layer. Furthermore, an inter-layer insulation layer is also set up on the substrate and the conductive plug is set up within the inter-layer insulation layer. The top surface of the conductive plug may protrude from the top surface of the inter-layer insulation layer and have a corner region. Alternatively, the top surface of the conductive plug is below the top surface of the inter-layer insulation layer to provide a recess cavity such that the aforementioned electrode fills up the recess cavity to produce at least a corner region. The dielectric layer can be a silicon oxide layer having a thickness between about 20 Å to 100 Å. The aforementioned OTPROM further includes a second memory cell. The second memory cell has a structure identical to the first memory cell. The select transistor of the second memory cell and the select transistor of the first memory cell use the same second source/drain region.

The one-time programmable read only memory of the present invention has a memory structure similar to a DRAM. A dielectric layer with a small thickness replaces the capacitor dielectric layer of the capacitor in a conventional DRAM. Through the breakdown or not of the dielectric layer, the conductive or not between the bit line and the electrode (the programming line) can be determined. Hence, the goal of storing a single bit of digital data inside the memory cell in a non-volatile way is achieved.

Furthermore, through the corner region resulting from the protrusion of the top surface of the conductive plug above the top surface of the inter-layer insulation layer, or the corner region resulting from the electrode filling the recess cavity when the top surface of the conductive plug is below the top surface of the inter-layer insulation layer, the dielectric layer can be easily broken down through a point discharge near the charge-concentrated corner. Ultimately, the operating voltage of the OTPROM is reduced.

In addition, the breakdown voltage and device performance of the memory can be controlled through a proper selection of the material and thickness of the dielectric layer.

The present invention also provides a method of operating a one-time programmable read only memory (OTPROM). The OTPROM includes at least a select transistor, an electrode and a dielectric layer disposed on a substrate, wherein the electrode is set up on the source region of the select transistor and the dielectric layer is set up between the electrode and the source region. To write a logic '1' data bit into the memory in a programming operation, a first positive voltage is applied to the drain region of the select transistor and a second positive voltage is applied to the electrode. Thereafter, a third positive voltage is applied to the gate of the select transistor to form the channel of the select transistor and transmit the first positive voltage on the drain region to the source region. Afterwards, the bias voltage applied to the gate of the select transistor is reduced from the third positive voltage to a fourth positive voltage. Hence, the voltage difference between the fourth positive voltage and the first positive voltage is lower than the threshold voltage of the select transistor and shuts down the channel. Then, the second positive voltage applied to the electrode is raised to a fifth positive voltage so that the voltage at the source region is self-raised through capacitance coupling to prevent F-N tunneling and hence a breakdown of the dielectric layer. To write a logic '0' data bit into the memory in a programming operation, a 0V bias voltage is applied to the drain region of the select transistor and the second positive voltage is applied to the electrode. Thereafter, the third positive voltage is applied to the gate of the select transistor to form the channel of the select transistor and transmit the 0V on the drain region to the source region. Afterwards, the bias voltage applied to the gate of the select transistor is reduced from the third positive voltage to the fourth positive voltage. At this moment, the voltage difference between the fourth positive voltage and the 0V is still greater than the threshold voltage of the select transistor. Hence, the voltage at the source region is maintained at 0V through the conductive select transistor. Then, the second positive voltage applied to the electrode is raised to the fifth positive voltage so that F-N tunneling is triggered leading to a breakdown of the dielectric layer due to the high voltage difference between the electrode and the source region.

To read data from the aforementioned method of operating the OTPROM, a sixth positive voltage is first applied to the drain region of the select transistor and then the third positive voltage is applied to the gate of the select transistor to form the channel of the select transistor. If the dielectric layer is in a breakdown state, then a current will pass through the dielectric layer so that the voltage applied to the drain will reduce. If the dielectric layer is not in a breakdown state, then no current will through the dielectric layer so that the voltage at the drain remains unchanged.

The operating mode of the OTPROM in the present invention utilizes the breakdown or not of the dielectric layer to set the conductance between the select transistor and the electrode and hence determines the content of the stored digital data. Hence, the reading mechanism for determining the stored content inside an OTPROM cell in the present invention differs from that of a conventional DRAM or a flash memory. Furthermore, unlike a conventional DRAM, the OTPROM has no need to perform any refresh operation. In other words, current waste is small and overall power consumption of the OTPROM is greatly reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
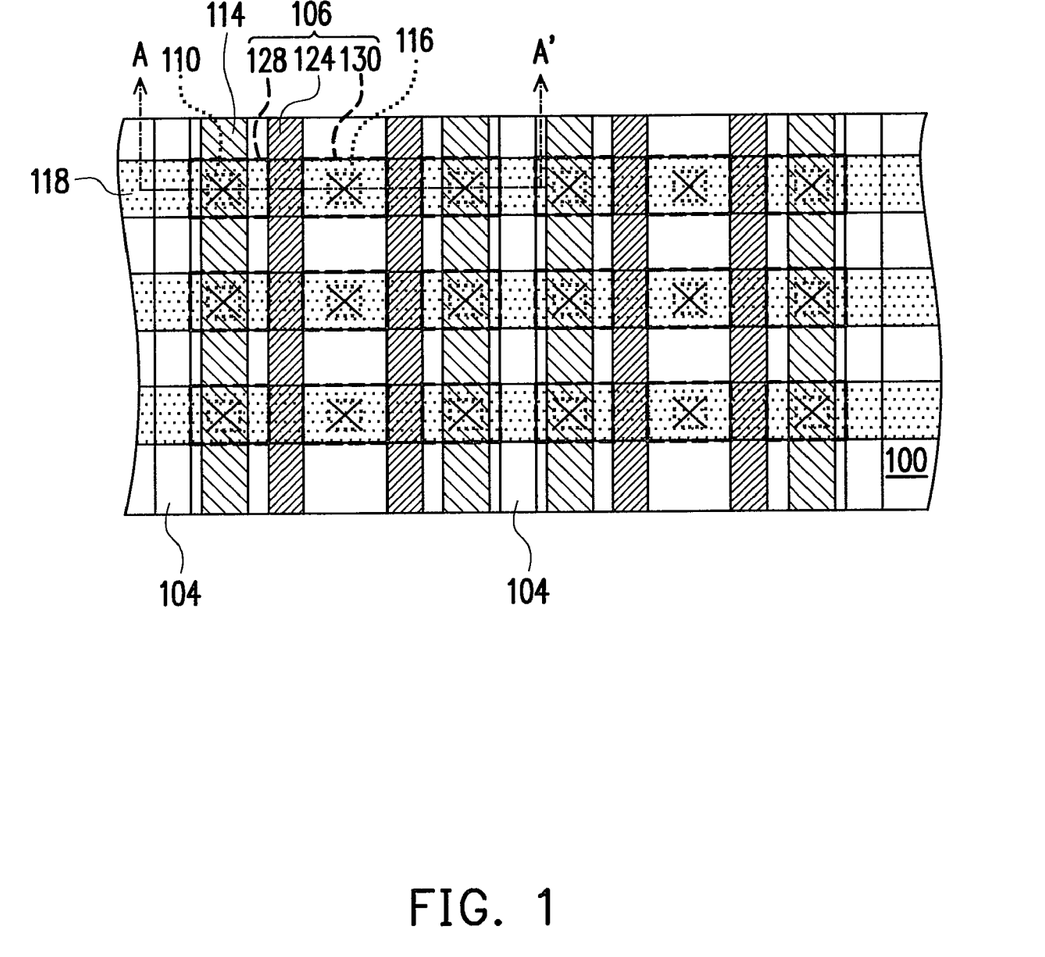
FIG. 1 is a top view showing the structure of a one-time programmable read only memory according to the present invention.
Figure 2A:
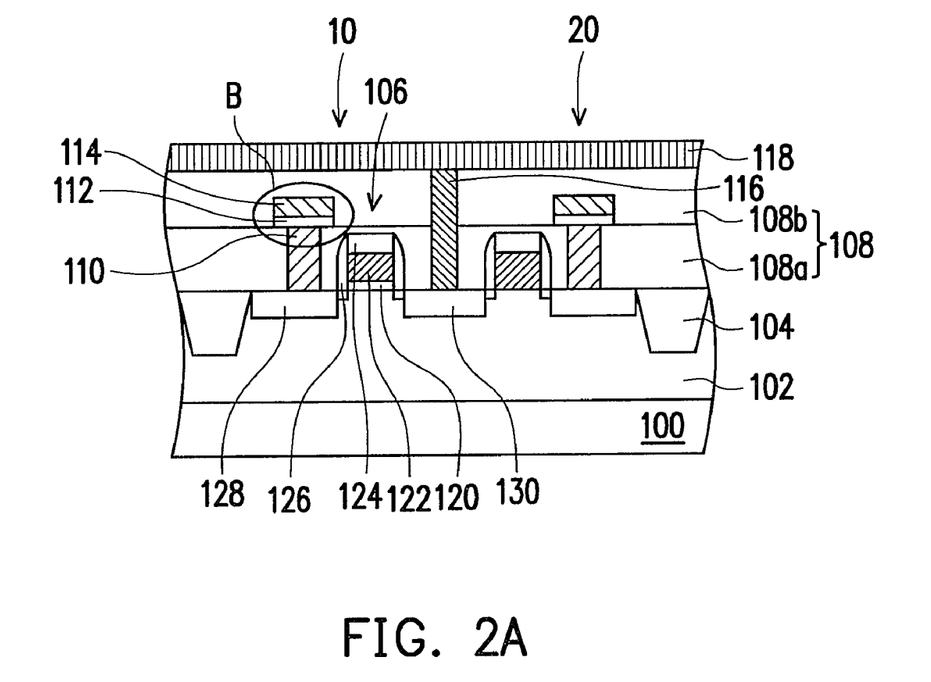
FIG. 2A is a schematic cross-sectional view along line A-A' of FIG. 1 according to one embodiment of the present invention.
Figure 2B:
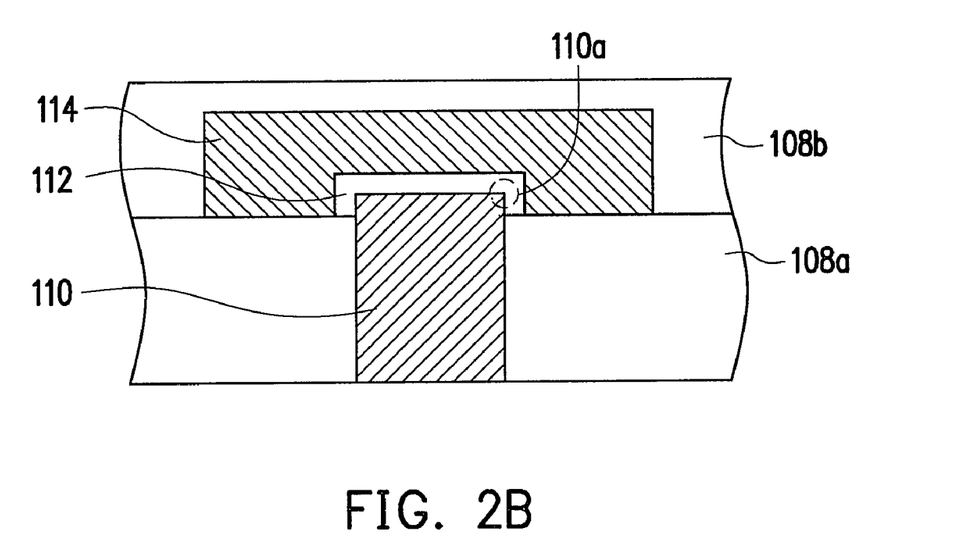
FIG. 2B is a magnified view of the B portion in FIG. 2A according to another embodied state.
Figure 2C:
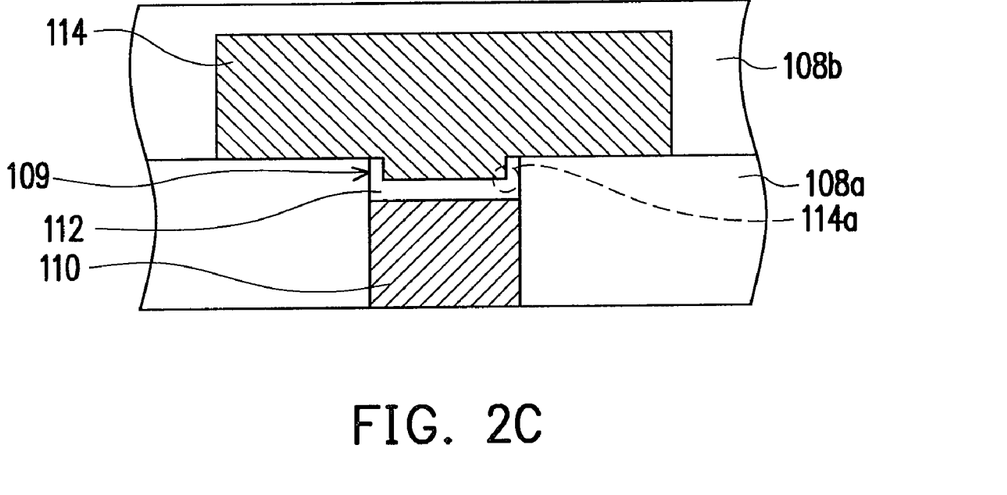
FIG. 2C is a magnified view of the B portion in FIG. 2A according to yet another embodied state.

FIG. 1 is a top view showing the structure of a one-time programmable read only memory according to the present invention. FIG. 2A is a schematic cross-sectional view along line A-A' of FIG. 1 according to one embodiment of the present invention. FIG. 2B is a magnified view of the B portion in FIG. 2A according to another embodied state. FIG. 2C is a magnified view of the B portion in FIG. 2A according to yet another embodied state.

As shown in FIGS. 1 and 2A, the one-time programmable read only memory of the present invention includes a first memory cell 10 and a second memory cell 20. In the present embodiment, the two memory cells use the same drain region 130. Obviously, in other embodiments, each memory cell may have a drain. Since the first memory cell 10 and the second memory cell 20 has an identical structure, only the memory cell 10 is explained in detail.

The memory cell 10 mainly includes a substrate 100, a P-type well 102, a device isolation structure 104, a select transistor 106, an inter-layer insulation layer 108, a conductive plug 110, a dielectric layer 112, an electrode 114, a conductive plug 116 and a conductive line 118 (a bit line).

The substrate 100 is a silicon substrate, for example. The P-type well 102 is disposed in the substrate 100. The device isolation structure 104 is disposed in the substrate 100 for isolating out an active region.

The select gate 106 is disposed within the active region of the substrate 100. The select gate 106 includes a gate dielectric layer 120, a gate 122, a cap layer 124, a spacer 126, a source region 128 and a drain region 130.

The gate 122 is disposed on the substrate 100. The gate 122 is fabricated using doped polysilicon, for example. Furthermore, the gate 122 serves as a word line for the memory cell 'A'. The gate dielectric layer 120 is set up between the gate 122 and the substrate 100. The gate dielectric layer 120 is fabricated using silicon oxide, for example. The cap layer 124 is set up on the top portion of the gate 122. The cap layer 124 is fabricated using a dielectric material, for example. The spacer 126 is set up on the sidewall of the gate 122. The source region 128 and the drain region 130 are disposed in the substrate 100 on each side of the gate 122. The source region 120 and the drain region 130 are N-doped regions, for example.

The inter-layer insulation layer 108 (comprising the inter-layer insulation layer 108a and the inter-layer insulation layer 108b) is set up on the substrate 100. The inter-layer insulation layer 108 is fabricated using an insulating material such as silicon oxide. The conductive plug is disposed within the inter-layer insulation layer 108 and electrically connected to the source region 128 of the select transistor 106. The electrode 114 (the programming line) is set up over the source region 128 of the select transistor 106. The dielectric layer 112 is disposed between the electrode 114 and the conductive plug 110. The dielectric layer 112 is fabricated using silicon oxide, for example. The dielectric layer 112 preferably has a thickness between about 20 Å to 100 Å. Obviously, the dielectric layer 112 can be fabricated using other dielectric material having a thickness equivalent to a silicon oxide layer with a thickness between about 20 Å to 200 Å. In general, the breakdown voltage of the memory and the performance of the device can be controlled through the selection of a suitable dielectric material with a proper thickness. For example, if the dielectric layer 112 is a silicon oxide layer having a thickness of about 70 Å, the voltage difference (the voltage difference between the electrode 114 (the programming line) and the source region 128) before the breakdown of the dielectric layer 112 occurs is about 10V. However, if the thickness of the dielectric layer 112 is reduced to about 40 Å, the voltage difference (the voltage difference between the electrode 114 (the programming line) and the source region 128) before the breakdown of the dielectric layer 112 occurs is only about 6V. The breakdown or not of the dielectric layer 112 determines the conduction between the conductive line (the bit line) and the electrode 114 (the programming line) so that the goal of storing a bit of digital data in the memory cell in a non-volatile state is achieved.

The conductive line 118 (the bit line) is set up on the inter-layer insulation layer 108b. Through the conductive plug 116, the conductive line 118 is connected to the drain region 130 of the select transistor 108.

Furthermore, as shown in FIG. 1, the select transistor of the second memory cell 20 and the select transistor of the first memory cell 10 use the same drain 130 as well as the same conductive line 118 (the bit line).

Figure 3:
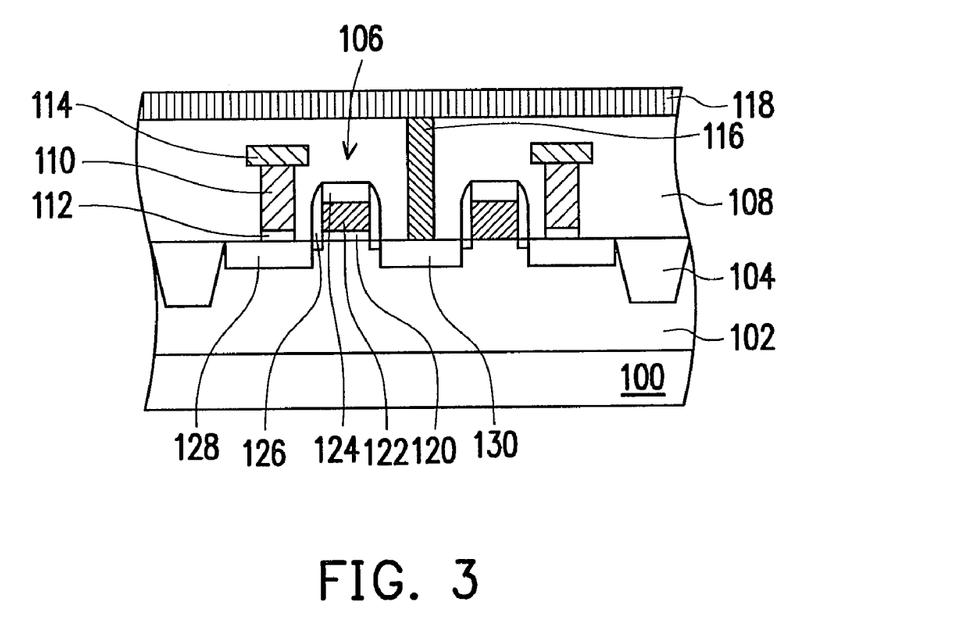
FIG. 3 is a schematic cross-sectional view showing the structure of a one-time programmable read only memory according to another embodiment of the present invention.

As shown in FIG. 2A, the dielectric layer 112 is formed over the planar conductive plug 110 and the inter-layer insulation layer 108a. However, the present invention is not limited as such. In FIG. 2B, another embodiment of the present invention is shown. As shown in FIG. 2B, the top surface of the conductive plug 110 protrudes from the top surface of the inter-layer insulation layer 108a and hence has at least a corner region 110a. With the establishment of the corner region 110, electric charges can easily concentrate around there to produce an electric discharge that breaks down the dielectric layer 112. Thus, the voltage for conditioning the dielectric layer 112 is reduced. Furthermore, as shown in FIG. 2C, the top surface of the conductive plug 110 can be below the top surface of the inter-layer insulation layer 108a to provide a recess cavity 109 such that the electrode 114 fills up the recess cavity 109 to produce at least a corner region 114a. Similarly, the corner region 114a will concentrate electric charges to facilitate an electric discharge that breaks down the dielectric layer 112. Thus, the voltage for conditioning the dielectric layer 112 is reduced. In addition, as shown in FIG. 3, the dielectric layer 112 can be directly set between the conductive plug 110 and the source region 128.

The one-time programmable read only memory (OTPROM) of the present invention has a memory structure very similar to the memory cell structure of a conventional DRAM. A dielectric layer with a small thickness replaces the capacitor dielectric layer of the capacitor in a conventional DRAM. Through the breakdown or not of the dielectric layer 112, the conductive or not between the conductive line 118 (the bit line) and the electrode 114 (the programming line) can be determined. Hence, the goal of storing a single bit of digital data inside the memory cell in a non-volatile way is achieved.

Furthermore, through the corner region 110a resulting from the protrusion of the top surface of the conductive plug 110 above the top surface of the inter-layer insulation layer 108a, or the corner region 114a resulting from the electrode 114 filling the recess cavity 109 when the top surface of the conductive plug 110 is below the top surface of the inter-layer insulation layer 108a, the dielectric layer 112 can be easily broken down through a point discharge near the charge-concentrated corner. Ultimately, the operating voltage of the OTPROM is reduced.

In addition, the breakdown voltage and device performance of the memory can be controlled through a proper selection of the material and thickness of the dielectric layer.

Figure 4:
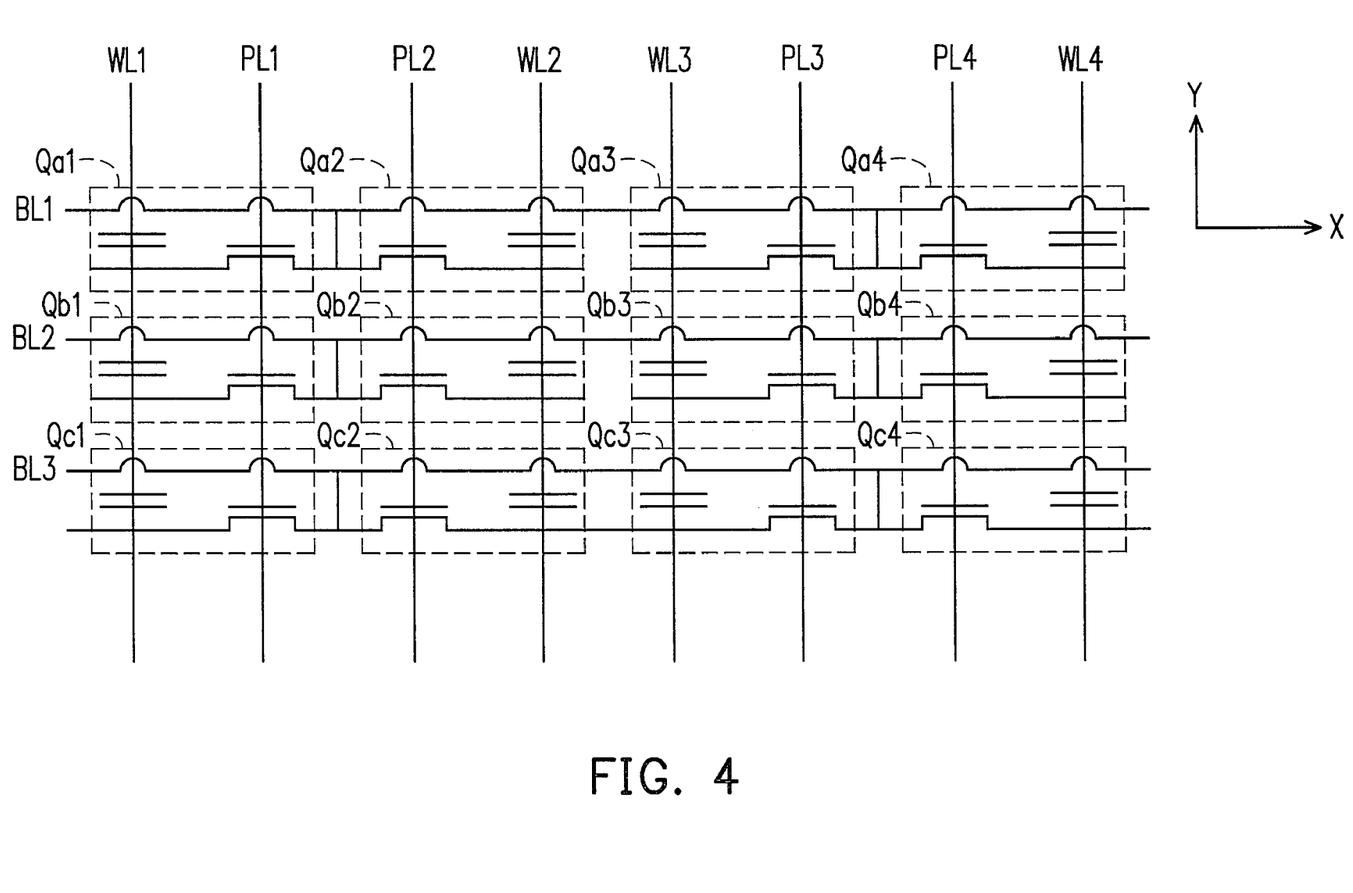
FIG. 4 shows an equivalent circuit diagram of a one-time programmable read only memory according to the present invention.

FIG. 4 shows an equivalent circuit diagram of a one-time programmable read only memory according to the present invention. As shown in FIG. 4, the one-time programmable read only memory of the present invention includes a plurality of memory cells Qa1~Qc4, a plurality of word lines WL1~WL4, a plurality of programming lines PL1~PL4 and a plurality of bit lines BL1~BL3.

The memory cells Qa1~Qc4 are laid down on the substrate to form a row/column array. In FIG. 4, the X direction is the row direction and the Y direction is the column direction. Each of the memory cells Qa1~Qc4 has a structure identical to the one shown in FIG. 2A. In the row direction, every pair of memory cells forms a group. In each memory group, the select transistor of the two memory cells uses the same drain region. In other words, the memory cells Qa1 and Qa2 form a memory group; the memory cells Qa3 and Qa4 form a group; the memory cells Qb1 and Qb2 form a memory group; the memory cells Qb3 and Qb4 form a memory group; the memory cell Qc1 and Qc2 form a memory group; and, the memory cell Qc3 and Qc4 form a memory group.

The word lines WL1~WL4 are laid down in parallel to the row direction with each one connected to the gate of the memory cells in the same column. In other words, the word line WL1 is connected to the gate of the select transistor of the memory cells Qa1~Qc1; the word line WL2 is connected to the gate of the select transistor of the memory cells Qa2~Qc2; the word line WL3 is connected to the gate of the select transistor of the memory cells Qa3~Qc3; and, the word line WL4 is connected to the gate of the select transistor of the memory cells Qa4~Qc4.

The programming lines PL1~PL4 are laid down in parallel to the column direction with each one connected to the electrode of the memory cells in the same column. In other words, the programming line PL1 is connected to the electrode of the memory cells Qa1~Qc1; the programming line PL2 is connected to the electrode of the memory cells Qa2~Qc2; the programming line PL3 is connected to the electrode of the memory cells Qa3~Qc3; and, the programming line PL4 is connected to the electrode of the memory cells Qa4~Qc4.

The bit lines BL1~BL3 are configured in parallel to the column direction with each one connected to the drain region of the select transistors of the memory cells in the same column. In other words, the bit line BL1 is connected to the drain region of the select transistor of the memory cells Qa1~Qa4; the bit line BL2 is connected to the drain region of the select transistor of the memory cells Qb1~Qb4; the bit line BL3 is connected to the drain region of the select transistor of the memory cells Qc1~Qc4.

Figure 5A:
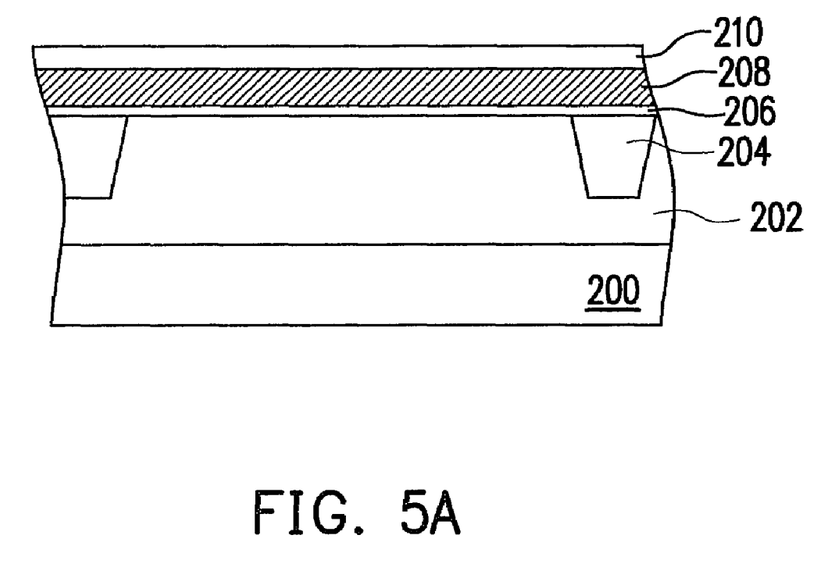
FIGS. 5A through 5E are schematic cross-sectional views showing the steps for fabricating a one-time programmable read only memory according to the present invention.

FIGS. 5A through 5E are schematic cross-sectional views showing the steps for fabricating a one-time programmable read only memory according to the present invention. As shown in FIG. 5A, a substrate 200 is provided. The substrate 200 is a silicon substrate, for example. The substrate 200 has a P-type well 202 and a device isolation structure 204 for defining an active region formed thereon. Thereafter, a dielectric layer 206, a conductive layer 208 and a cap layer 210 are sequentially formed over the substrate 200. The dielectric layer 206 is a silicon oxide layer formed, for example, by performing a thermal oxidation process. The conductive layer 208 is a doped polysilicon layer, for example. The conductive layer 208 is formed, for example, by performing a chemical vapor deposition process with in-situ dopant implant or forming an undoped polysilicon layer over the substrate 200 in a chemical deposition process followed by performing an ion implant process. The cap layer is an insulating material layer including a silicon oxide layer or a silicon nitride layer formed, for example, by performing a chemical vapor deposition process.

Figure 5B:
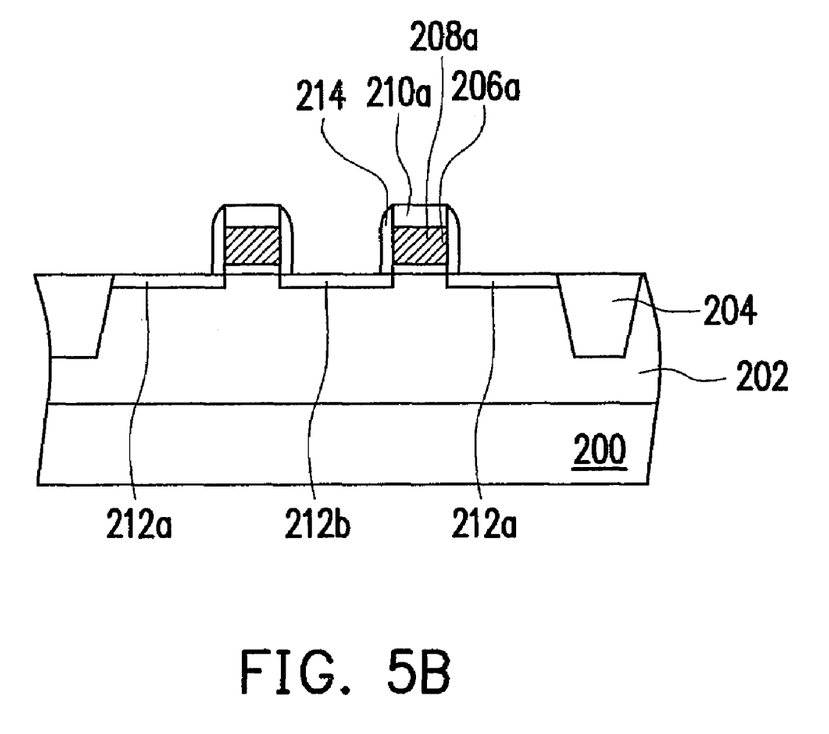

As shown in FIG. 5B, the cap layer 210, the conductive layer 208 and the dielectric layer 206 are patterned to form a cap layer 210a, a gate 208a and a gate dielectric layer 206a. Thereafter, a dopant implantation is carried out to form a first lightly doped region 212a and a second lightly doped drain region 212b in the substrate 200 on each side of the gate 208a. The implanted dopants are N-type dopants, for example. After that, spacers 214 are formed on the sidewalls of the gate 208a. The spacers 214 are formed, for example, by depositing insulating material to form an insulation layer and then performing an etching operation to remove a portion of the insulation layer so that only the insulating material layer beside the gate 208a is retained.

Figure 5C:
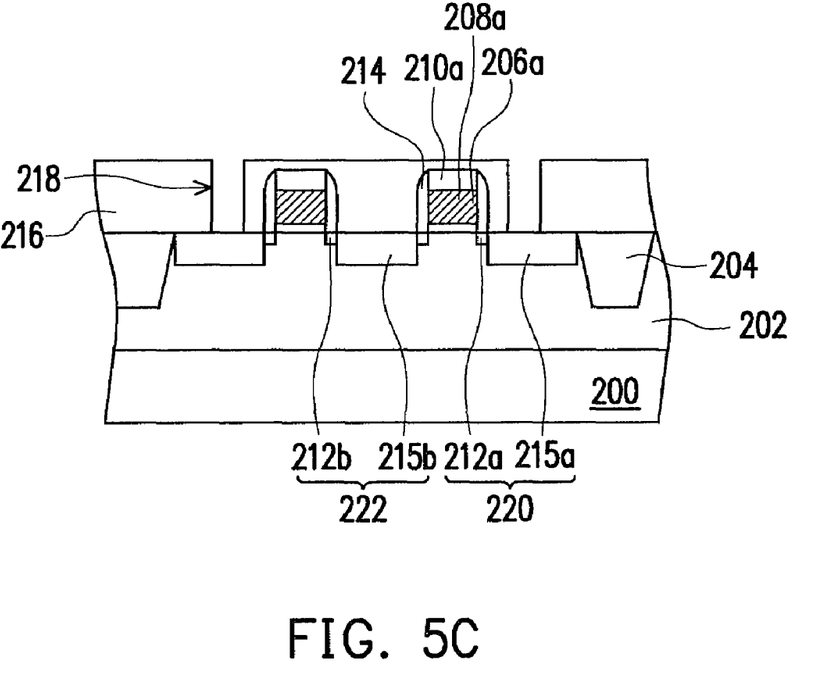

As shown in FIG. 5C, using the gate 208a and the spacers 214 as a mask, another dopant implant is carried out to form a first heavily doped region 215a and a second heavily doped region 215b. The lightly doped region 212a and the heavily doped region 215a together form the source region 220 while the lightly doped region 212b and the heavily doped region 215b together form the drain region 222.

Thereafter, an inter-layer insulation layer 216 is formed over the substrate 200. Then, an opening 218 that exposes the source region 220 is formed in the inter-layer insulation layer 216. The inter-layer insulation layer 216 is a silicon oxide layer formed, for example, by performing a chemical vapor deposition process using tetra-ethyl-ortho-silicate (TEOS)/ozone ($O_3$) as the reactive gases.

Figure 5D:
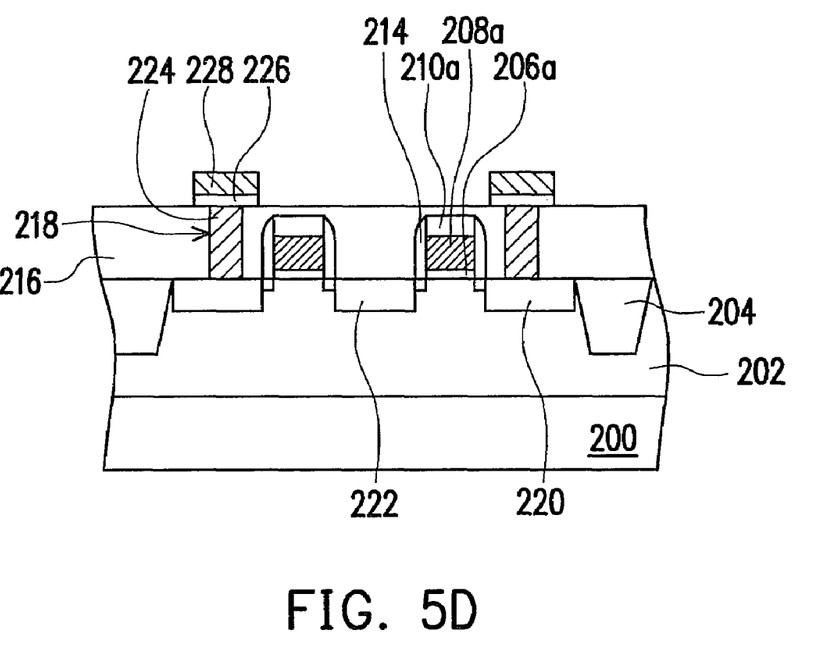

As shown in FIG. 5D, a conductive plug 224 is formed inside the opening 218 of the inter-layer insulation layer 216. The method of forming the conductive plug 224 includes forming a conductive layer (not shown) over the substrate 200 to fill the opening 218 and then performing a chemical-mechanical polishing operation or a back etching operation to remove the conductive layer outside the opening 218. Thereafter, a dielectric layer 226 is formed over the conductive plug 224. The dielectric layer 226 can be a silicon oxide layer formed, for example, by performing a chemical vapor deposition process or performing a thermal oxidation process. The dielectric layer 226 preferably has a thickness between about 20 Å to 100 Å. Obviously, the dielectric layer 226 can be fabricated using other dielectric material. Through the selection of a suitable dielectric material and the formation of a dielectric layer with appropriate thickness, the breakdown voltage and device performance of the memory can be controlled. After that, an electrode 228 is formed over the dielectric layer 226 so that the dielectric layer 226 is clamped between the conductive plug 224 and the electrode 228. The method of forming the electrode 228 includes, for example, forming a conductive layer (not shown) over the substrate and then patterning the conductive layer.

Figure 5E:
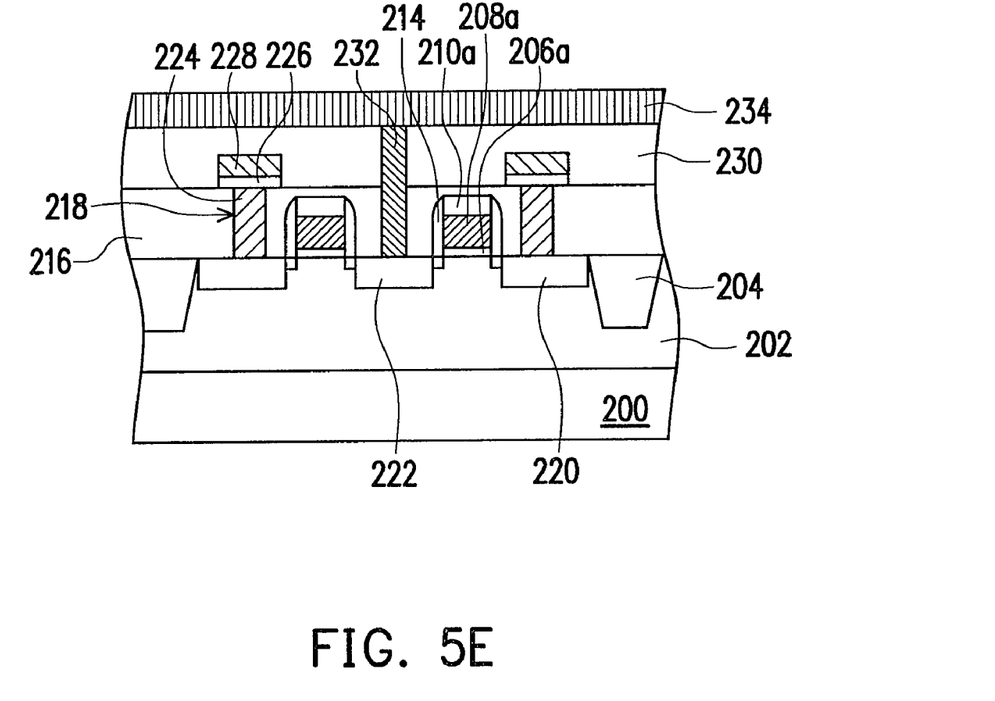

As shown in FIG. 5E, another inter-layer insulation layer 230 is formed over the substrate 200. The inter-layer insulation layer 230 is a silicon oxide layer formed, for example, by performing a chemical vapor deposition process using tetra-ethyl-ortho-silicate (TEOS)/ozone ($O_3$) as the reactive gases. Thereafter, a conductive plug 232 is formed in the inter-layer insulation layer 230 and the inter-layer insulation layer 216 to connect electrically with the drain region 222. Then, a conductive line 234 (a bit line) is formed over the inter-layer insulation layer 230 to connect electrically with the conductive plug 232.

The method of fabricating the one-time programmable read only memory of the present invention is compatible with the process of fabricating a conventional DRAM. The process in the present invention is also simpler so that overall production cost can be reduced. Furthermore, in another embodiment of the present invention, the top surface of the conductive plug may protrude above the top surface of the inter-layer insulation layer to provide a corner region, or alternatively, the top surface of the conductive plug may sack below the top surface of the inter-layer insulation layer to provide a recess cavity so that the subsequently formed electrode inside the cavity has a corner region. The goal of raising the top surface of the conductive plug above the top surface of the inter-layer insulation layer or lowering the top surface of the conductive plug below the top surface of the inter-layer insulation layer can be achieved through an etching operation. Hence, a point discharge is easily triggered through a charge concentration near the corner region of the conductive plug or the electrode. In other words, the dielectric layer can be broken down at a lower voltage so that the operating voltage of for programming data into the memory is reduced. In yet another embodiment of the present invention, the dielectric layer is directly formed on the surface of the source region before forming the conductive plug. That means, the dielectric layer is formed between the source and the conductive plug.

Figure 6A:
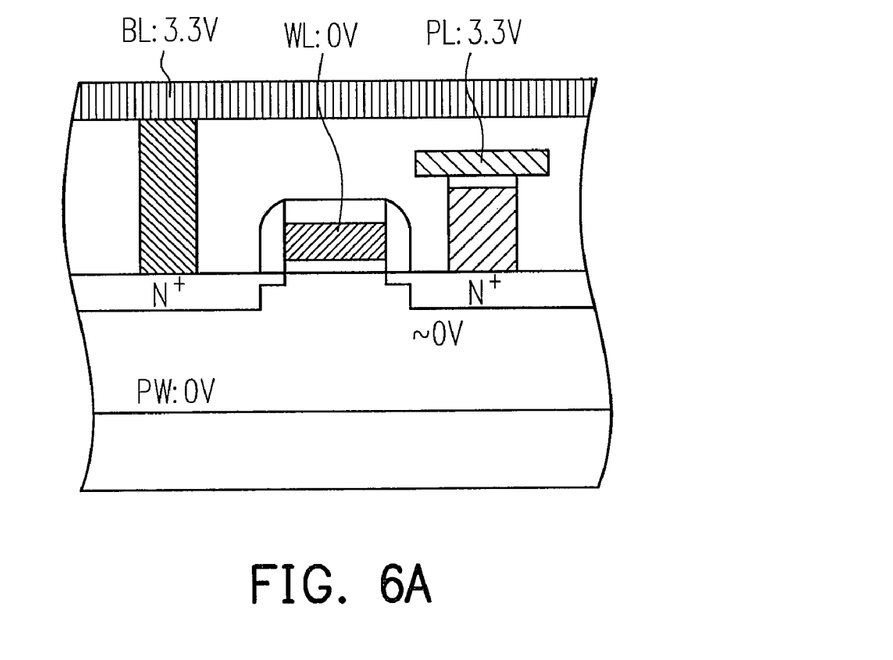
FIGS. 6A through 6C are diagrams showing the steps for writing a logic '1' bit of data into a one-time programmable read only memory cell according to the present invention.
Figure 6B:
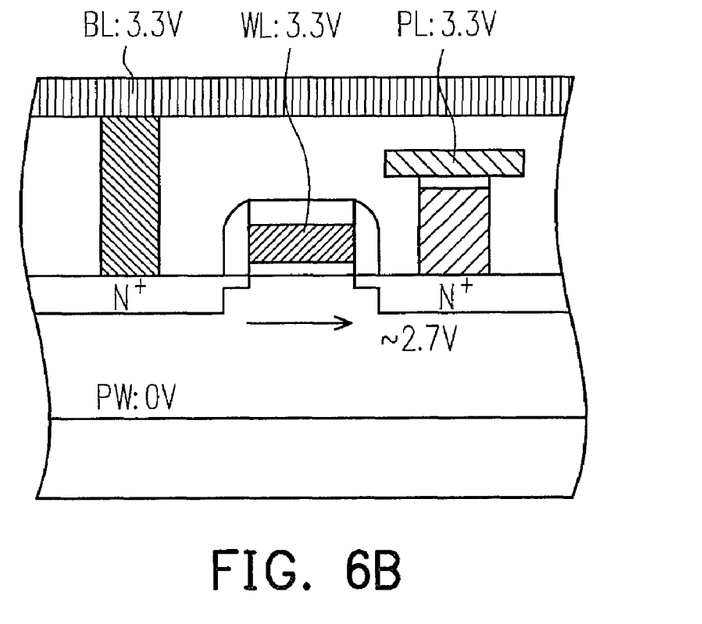
Figure 6C:
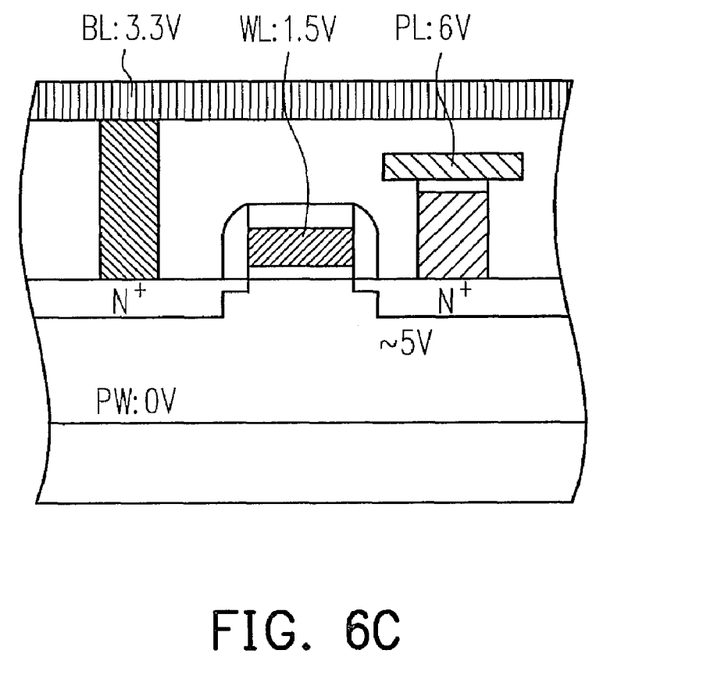
Figure 7A:
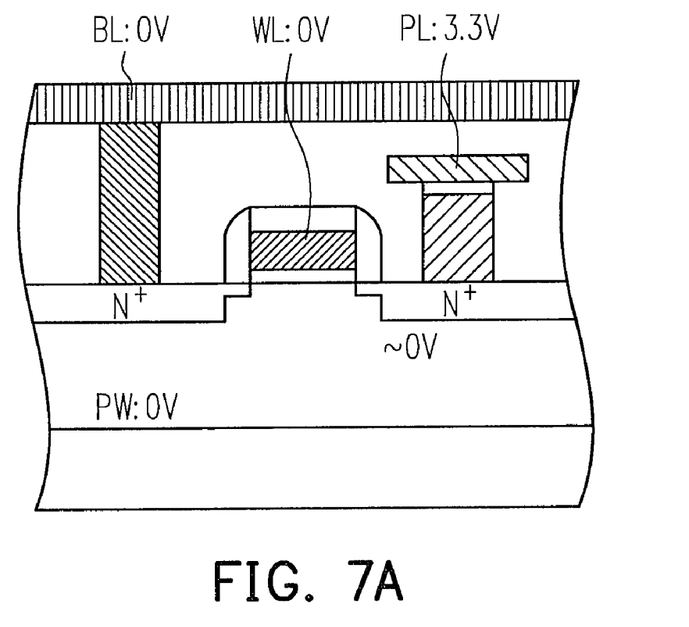
FIGS. 7A through 7C are diagrams showing the steps for writing a logic '0' bit of data into a one-time programmable read only memory cell according to the present invention.
Figure 7B:
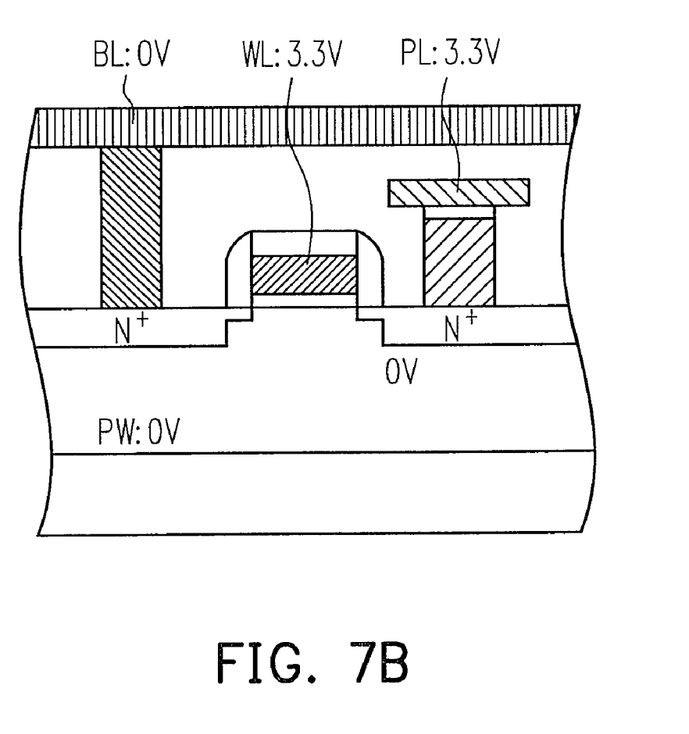
Figure 7C:
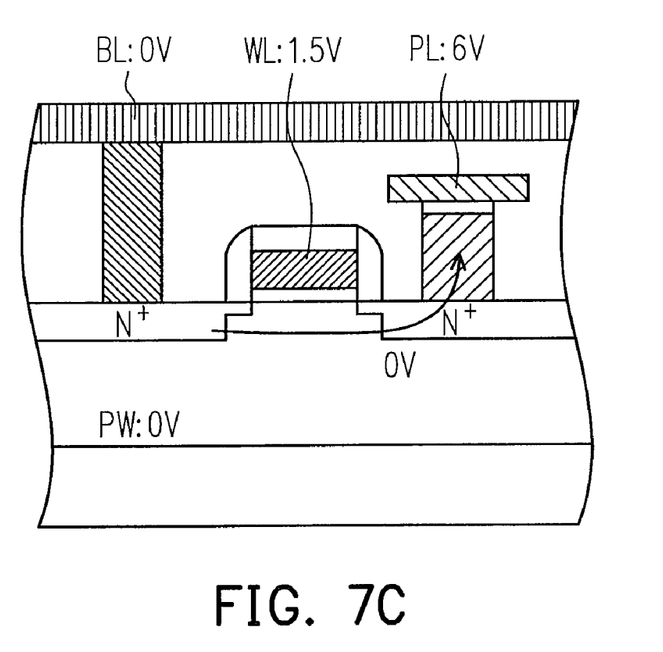

FIGS. 6A through 6C are diagrams showing the steps for writing a logic '1' bit of data into a one-time programmable read only memory cell according to the present invention. FIGS. 7A through 7C are diagrams showing the steps for writing a logic '0' bit of data into a one-time programmable read only memory cell according to the present invention.

First, the programming operation of writing a logic '1' bit of data into the one-time programmable read only memory of the present invention is explained with reference to FIGS. 6A through 6C. First, as shown in FIG. 6A, a voltage of about 3.3V is applied to the bit line BL (the drain region of the select transistor), a voltage of about 3.3V is applied to the programming line PL (the electrode) and the source region is maintained at 0V, for example.

As shown in FIG. 6B, a voltage of about 3.3V is applied to the word line WL (the gate of the select transistor) to form the channel of the select transistor. Hence, electrons in the drain region of the select transistor can flow to the source region via the channel of the select transistor so that the voltage in the source region is raised from 0V to about 2.7V, for example.

As shown in FIG. 6C, the bias voltage applied to the programming line PL (the electrode) is raised from 3.3V to about 6V so that the voltage of the word line WL (the gate of the select transistor) drops from 3.3V to about 1.5V. Hence, the voltage difference between the gate of the select transistor and the drain region of the select transistor is below the threshold voltage of the select transistor and the channel of the select transistor is shut. Through capacitance coupling, the voltage in the source region is self-increased from 2.7V to about 5V, for example. This prevents the occurrence of the F-N tunneling. Thus, the dielectric layer will not break down and the memory cell is programmed to a logic '1' state.

Next, the programming operation of writing a logic '0' bit of data into the one-time programmable read only memory of the present invention is explained with reference to FIGS. 7A through 7C. As shown in FIG. 7A, a 0V is applied to the bit line BL (the drain region of the select transistor), a voltage of about 3.3V is applied to the programming line PL (the gate of a trench-type transistor) and the source region is maintained at 0V, for example.

As shown in FIG. 7B, a voltage of about 3.3V is applied to the word line WL (the gate of the select transistor) to form the channel of the select transistor. Hence, electrons in the drain region of the select transistor can flow to the source region via the channel of the select transistor so that the voltage in the source region is maintained at 0V, for example.

As shown in FIG. 7C, the bias voltage applied to the programming line PL (the gate of a trench-type transistor) is raised from 3.3V to about 6V so that the voltage of the word line WL (the gate of the select transistor) drops from 3.3V to about 1.5V. At this moment, the voltage difference between the word line WL (the gate of the select transistor) and the bit line BL (the drain region of the select transistor) is still greater than the threshold voltage of the select transistor. Therefore, the voltage at the source region is maintained at about 0V through the channel of the select transistor. Hence, a large voltage difference exists between the programming line PL and the source region. This leads to F-N tunneling and the breakdown of the dielectric layer. Ultimately, the memory cell is programmed to a logic '0' state.

Figure 8A:
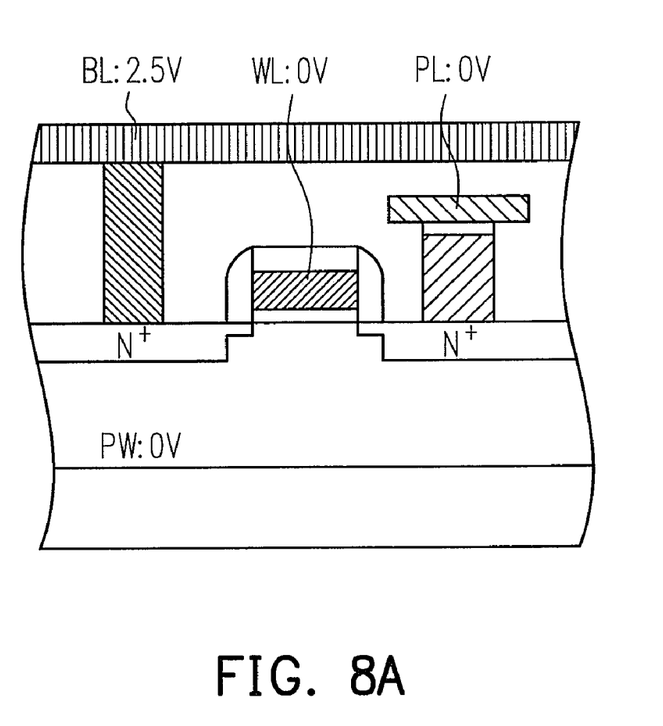
FIGS. 8A through 8C are diagrams showing the steps for reading digital data from a one-time programmable read only memory cell according to the present invention.
Figure 8B:
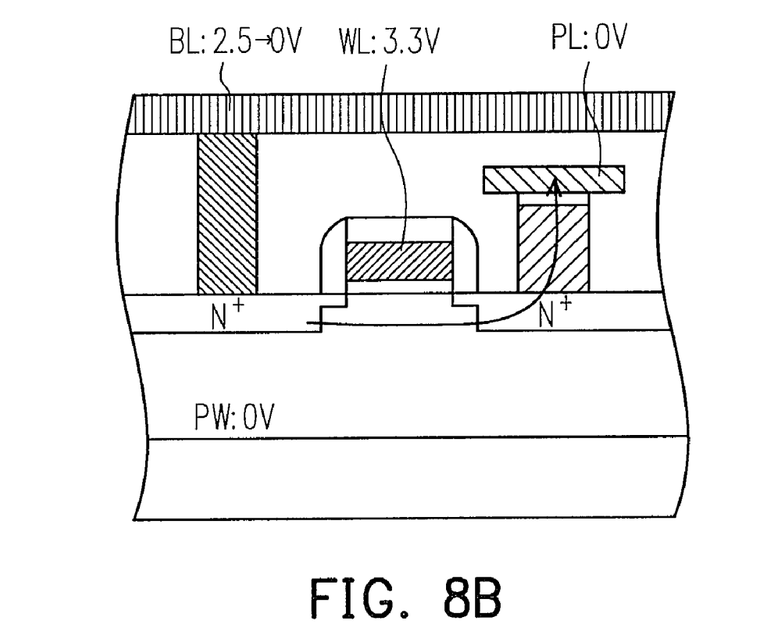
Figure 8C:
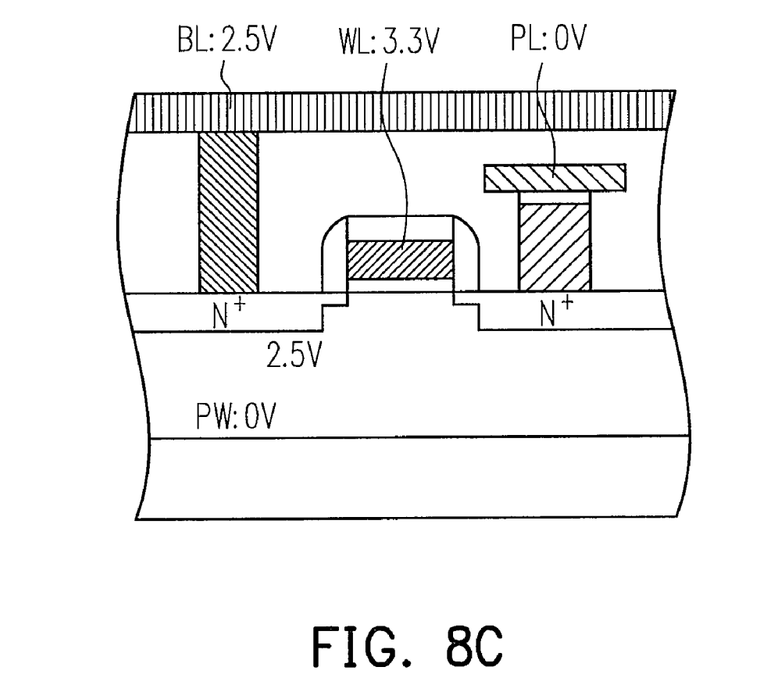

FIGS. 8A through 8C are diagrams showing the steps for reading digital data from a one-time programmable read only memory cell according to the present invention. As shown in FIG. 8A, a voltage of about 2.5V is applied to the bit line BL (the drain region of the select transistor) and a 0V is applied to the programming line PL (the electrode).

Thereafter, a voltage between about 2.5~5V is applied to the word line WL (the gate of the select transistor) to form the channel of the select transistor. If the dielectric layer has already been broken down previously, the select transistor and the electrode conduct to carry electrons away through the conductive line. Therefore, the voltage on the bit line BL (the drain region of the select transistor) will drop to approach 0V as shown in FIG. 8B. On the other hand, if the dielectric layer remains unbroken, the select transistor and the electrode are non-conductive and electrons will not be channeled away through the conductive line. Hence, the voltage on the bit line BL (the drain region of the drain region) is maintained at around 2.5V as shown in FIG. 8C. Consequently, by reading out the voltage on the bit line, the value of the digital data stored inside the memory cell, be it a '1' or a '0', can be determined.

The operating mode of the one-time programmable read only memory (OTPROM) in the present invention utilizes the breakdown or not of the dielectric layer to set the conductance between the select transistor and the electrode and hence determines the content of the stored digital data. Hence, the reading mechanism for determining the stored content inside an OTPROM cell in the present invention differs from that of a conventional DRAM or a flash memory. Furthermore, unlike a conventional DRAM, the OTPROM has no need to perform any refresh operation. In other words, current waste is small and overall power consumption of the OTPROM is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a one-time programmable read only memory having at least a select transistor over a substrate, an electrode and a dielectric layer such that the electrode is set up on a source region of the select transistor and the dielectric layer is set up between the electrode and the source region, the method comprising the steps of:

performing a programming operation to write a digital data value of '1' into the memory, including:

applying a first positive voltage to a drain region of the select transistor and applying a second positive voltage to the electrode;

applying a third positive voltage to a gate of the select transistor so that a channel of the select transistor is formed; and reducing the bias voltage applied to the gate of the select transistor from the third positive voltage to a fourth positive voltage and raising the second positive voltage applied to the electrode to a fifth positive voltage to prevent F-N tunneling and a breakdown of the dielectric layer from happening; and performing a programming operation to write a digital data value of '0' into the memory, including:

applying a bias voltage of 0V to the drain region of the select transistor and applying the second positive voltage to the electrode;

applying the third positive voltage to the gate of the select transistor so that the channel of the select transistor is formed; and reducing the bias voltage applied to the gate of the select transistor from the third positive voltage to the fourth positive voltage and raising the second positive voltage applied to the electrode to the fifth positive voltage to trigger F-N tunneling for breaking down the dielectric layer.

2. The operating method of claim 1, wherein an operation of reading data from the memory comprises:

applying a sixth positive voltage to the drain region of the select transistor; and applying a seventh positive voltage to the gate of the select transistor to form the channel of the select transistor.

3. The operating method of claim 1, wherein the first positive voltage, the second positive voltage and the third positive voltage are about 3.3V.

4. The operating method of claim 1, wherein the fourth positive voltage is about 1.5V.

5. The operating method of claim 1, wherein the fifth positive voltage is between about 6~10V.

6. The operating method of claim 2, wherein the sixth positive voltage is about 2.5V.

7. The operating method of claim 2, wherein the seventh positive voltage is between about 2.5~5V.

* * * * *